United States Patent [19]
Kawaguchi

[11] Patent Number: 6,067,242
[45] Date of Patent: May 23, 2000

[54] CURRENT BALANCED ARMS OF AC/DC BRIDGE RECTIFIERS

[75] Inventor: Akira Kawaguchi, Saitama-ken, Japan

[73] Assignee: Kabushiki Kaisha Toshiba, Kawasaki, Japan

[21] Appl. No.: 08/982,078

[22] Filed: Dec. 1, 1997

[30] Foreign Application Priority Data

Dec. 2, 1996 [JP] Japan ................................ 8-321633

[51] Int. Cl.$^7$ ................................................ H02M 7/155
[52] U.S. Cl. ........................ 363/129; 363/127; 363/132; 363/137
[58] Field of Search .................................. 363/17, 27, 28, 363/58, 132, 136, 137, 138, 53, 54, 127, 128, 129

[56] References Cited

U.S. PATENT DOCUMENTS

| 4,752,866 | 6/1988 | Huynh et al. | 363/138 |
| 5,287,260 | 2/1994 | Uchino | 363/58 |

FOREIGN PATENT DOCUMENTS 2505080  4/1996  Japan .

*Primary Examiner*—Jeffrey Sterrett
*Attorney, Agent, or Firm*—Oblon, Spivak, McClelland, Maier & Neustadt, P.C.

[57] ABSTRACT

A power converter comprises parallel circuits by providing two series circuits composed by self-arc-suppressing semiconductors, reactors and diodes. Moreover, unbalance of the currents flowing in the two parallel circuits is prevented by connecting the terminals of the two reactors to each other via capacitors.

9 Claims, 4 Drawing Sheets

CURRENT BALANCED ARMS OF AC/DC BRIDGE RECTIFIERS

BACKGROUND OF THE INVENTION

1. Field of the Invention

This invention relates to power converters, and more particularly, to high voltage, large capacity power converters which connect in series multiple self-turn-off switching devices.

2. Description of the Related Art

In recent years, power converters which can supply high voltages and large currents have been desired. In particular, the ability to supply 2000~3000 A or more at 100~500 KV is required by DC transmission and the like.

FIG. 1 is an example of the composition of a prior art power converter for high-voltage and large current.

In FIG. 1, AC power source 1 is connected to converter 3 via transformer 2. Converter 3 is composed by bridge-connected switch units 21~26. Switch unit 21 is composed of self-turn-off switching devices which are bridge-connected. Here, an example of the case of composition using gate turn-off thyristors (hereafter, simply "GTO") is described. DC reactor 4 smooths the DC output current of converter 3. The DC output of converter 3 is connected to DC circuit load 5 via DC reactor 4.

Switch unit 21 is composed of GTO 6, GTO 7, diode 8, diode 9 and capacitor 11. Since switch units 22~26 are of the same composition as switch unit 21, their descriptions are omitted. Converter 3 converts AC power and DC power between AC power source 1 and DC circuit 5 bidirectionally by a 3-phase bridge composed of switch units 21~26.

In this example, an arm consists of one switch unit. However, arms may be formed by executing an appropriate number of parallel connected switch units, DC connections or the like.

Next, in FIG. 2, the operation of switch unit 21 is described.

In FIG. 2($a$), unit 21 is in the conducting (ON) state. The current is divided into parallel paths; a first path passing through diode 8 and GTO 6, and a second path passing through GTO 7 and diode 9. The flow of the current is shown by the arrows.

FIG. 2($b$) shows the state in switch unit 21 immediately after GTO 6 and GTO 7 have turned OFF. The current flows by the path of diode 8, capacitor 11 and diode 9, and charges capacitor 11. When capacitor 11 is charged and the current becomes zero, switch unit 21 will be in the broken (OFF) state.

In FIG. 2($c$), switch unit 21 is in the above-mentioned broken (OFF) state.

FIG. 2($d$) shows the state immediately after GTO 6 and GTO 7 have turned ON. The current flows by the path of GTO 7, capacitor 11 and GTO 6, and discharges the charge accumulated in capacitor 11. When capacitor 11 is discharged, diode 8 and diode 9 turn ON, and the current becomes in the state shown in FIG. 2($a$).

Thereafter, the states in FIG. 2($a$)~FIG. 2($d$) are repeated.

With the above type of power converter, there was the problem that the balance of the two parallel sharing currents in FIG. 2($a$) (that is to say, the current sharing between each element) could not be maintained due to differences in dynamic characteristics, such as the switching characteristics of the GTO and diode circuit-composition elements, and static characteristics, such as forward voltage-drop, during transitions such as from the state in FIG. 2($d$) to FIG. 2($a$). If the current sharing cannot be maintained, the current in either of the two GTOs or diodes is biased, and the loss in that GTO or diode becomes greater. Ultimately, this is due to dependence on the randomness of the element.

When designing a power converter, the system must be designed taking this unbalance into consideration beforehand. In the end, the poorer the utilization factors of the elements, the higher becomes the cost of the system.

SUMMARY OF THE INVENTION

That being the case, one object of the present invention is to provide a power converter designed to maintain the balance of the currents flowing in two parallel circuits when bridges are composed by self-turn-off switching devices and diodes.

Another object of the present invention is to provide a power converter which, as well as balancing the currents flowing in two parallel circuits, can make the combined capacitance of the capacitors greater by increasing the number of capacitors which couple the two parallel circuits, and can also reduce the inductance capacitance of the circuit as a whole.

Yet another object of the present invention is to provide a power converter which, as well as balancing the currents flowing in two parallel circuits, can, once the currents have been balanced, reduce the inductance part of the parallel circuits and can reduce the energy loss.

A further object of the present invention is to provide a power converter which, as well as balancing the currents flowing in two parallel circuits, works on the transient currents flowing in the parallel circuits (particularly when the current is rising), and, once the currents are balanced, can reduce the inductance part of the parallel circuits and can reduce the energy loss.

A still further object of the present invention is, as well as balancing the current flowing in two parallel circuits, to provide a low-cost power converter.

The above object of the present invention can be achieved by providing a power converter fulfilling the following structural conditions. A first series circuit is composed by one end of a first reactor being connected to the cathode of a first self-turn-off switching device, while the anode of a first diode is connected to the other end of the first reactor. A second series circuit is composed by one end of a second reactor being connected to the cathode of a second diode, while the anode of a second self-turn-off switching device is connected to the other end of the second reactor. A first capacitor is connected between a first series connection point, formed by the cathode of the first self-turn-off switching device and the one end of the first reactor, and a second series connection point, formed by the cathode of the second diode and the one end of the second reactor. A second capacitor is connected between a third series connection point, formed by the anode of the first diode and the other end of the first reactor, and a fourth series connection point, formed by the anode of the second self-turn-off switching device and the other end of the second reactor.

The arms are composed by connecting multiple switching units, formed by connecting in common the cathode of the second self-turn-off switching device and the cathode of the first diode, and connecting in common the anode of the second diode and the anode of the first self-turn-off switching device.

Another object of the present invention can be achieved by providing a power converter fulfilling the following structural conditions. A first series circuit is composed by one end of a first reactor being connected to the cathode of a first self-turn-off switching device, while one end of a second reactor is connected to the other end of the first reactor, and the anode of a first diode is connected to the other end of the second reactor. A second series circuit is composed by one end of a third reactor being connected to the cathode of a second diode, while one end of a fourth reactor is connected to the other end of the third reactor, and the anode of a second self-turn-off switching device is connected to the other end of the fourth reactor. A first capacitor is connected between a first series connection point, formed by the cathode of the first self-turn-off switching device and the one end of the first reactor, and a second series connection point, formed by the cathode of the second diode and the one end of the third reactor. A second capacitor is connected between a third series connection point, formed by the other end of the first reactor and the one end of the second reactor, and a fourth series connection point, formed by the other end of the third reactor and the one end of the fourth reactor. A third capacitor is connected between a fifth series connection point, formed by the anode of the first diode and the other end of the second reactor, and a sixth series connection point, formed by the anode of the second self-turn-off switching device and the other end of the fourth reactor.

The arms are composed by connecting multiple switching units, formed by connecting in common the cathode of the second self-turn-off switching device and the cathode of the first diode, and connecting in common the anode of the second diode and the anode of the first self-turn-off switching device.

Yet another object of the present invention can be achieved by providing a power converter fulfilling the following structural conditions. A first series circuit is composed by one end of the first winding of a reactor having at least two or more coupled windings being connected to the cathode of a first self-turn-off switching device, while the anode of a first diode is connected to the other end of the first winding of the reactor. A second series circuit is composed by one end of the second winding of the reactor being connected to the cathode of a second diode, while the anode of a second self-turn-off switching device is connected to the other end of the second winding of the reactor. A first capacitor is connected between a first series connection point, formed by the cathode of the first self-turn-off switching device and the one end of the first winding of the reactor, and a second series connection point, formed by the cathode of the second diode and the one end of the second winding of the reactor. A second capacitor is connected between a third series connection point, formed by the anode of the first diode and the other end of the first winding of the reactor, and a fourth series connection point, formed by the anode of the second self-turn-off switching device and the other end of the second winding of the reactor.

The arms are composed by connecting multiple switching units, formed by connecting in common the cathode of the second self-turn-off switching device and the cathode of the first diode, and connecting in common the anode of the second diode and the anode of the first self-turn-off switching device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
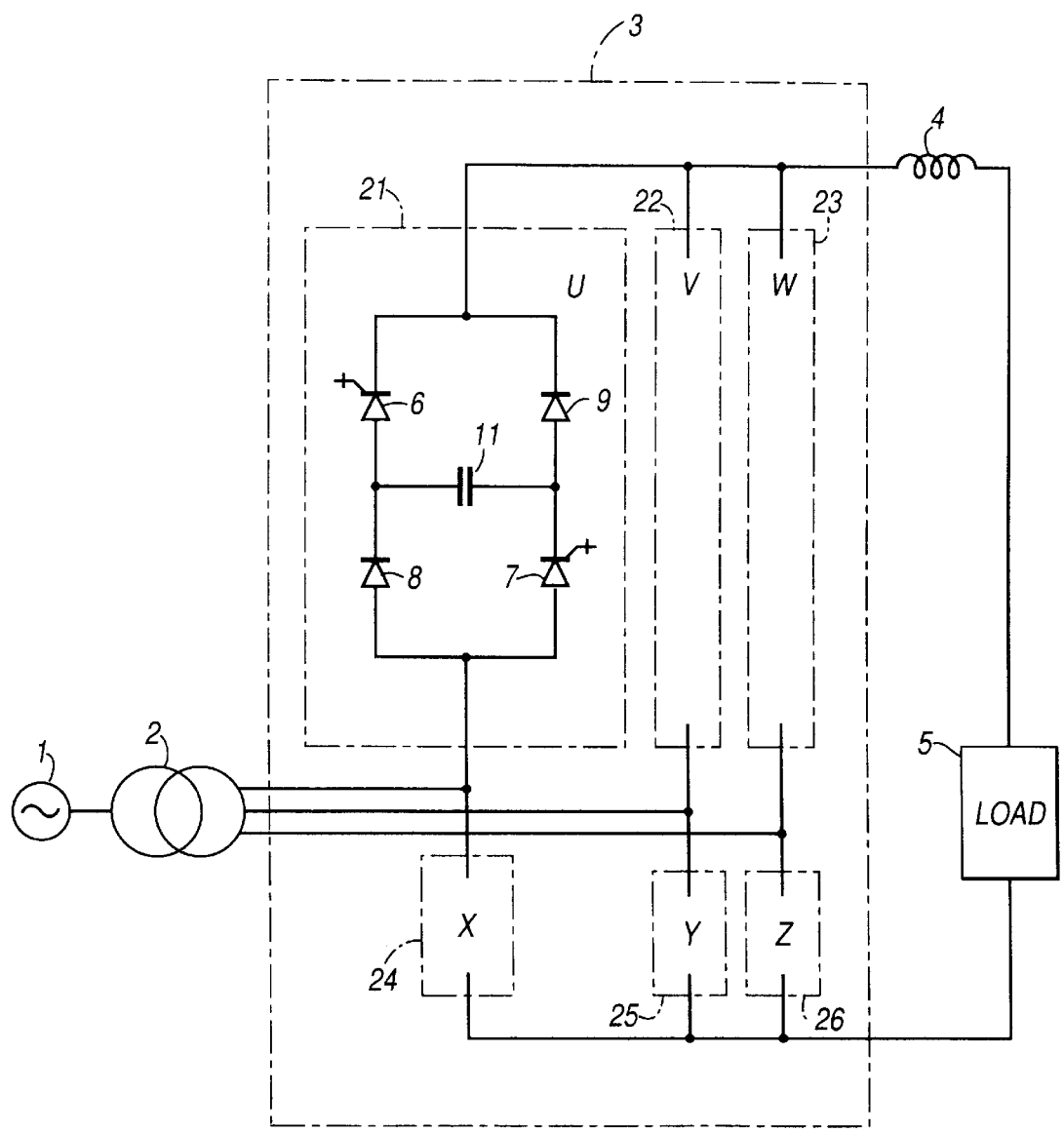
FIG. 1 is a prior art power converter.
Figure 2:
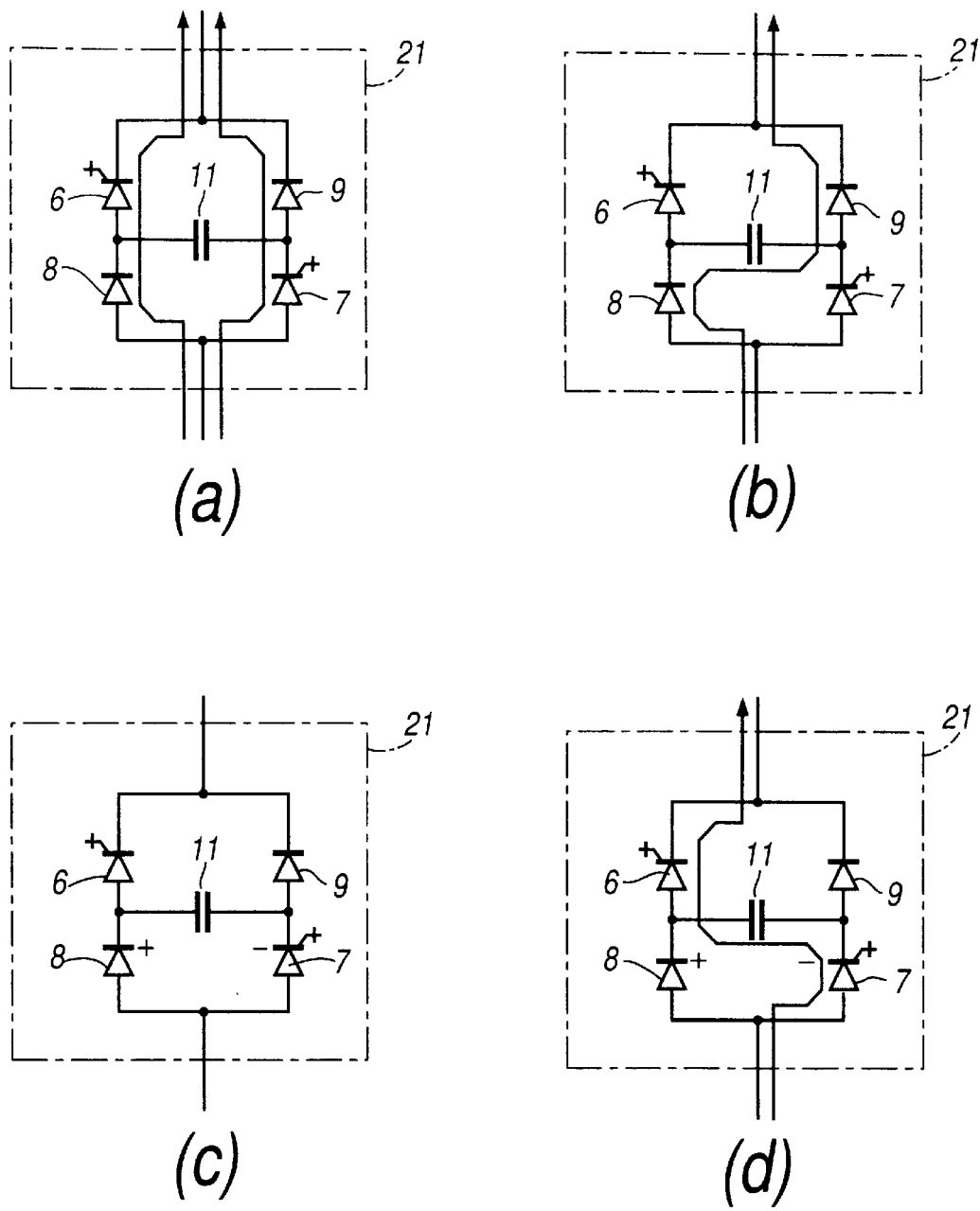
FIG. 2 is a drawing showing the operation of a prior art power converter.

Referring now to the drawings, wherein like reference numerals designate identical or corresponding parts throughout the several views, and more particularly to FIG. 3 thereof, one embodiment of the present invention will be described.

Figure 3:
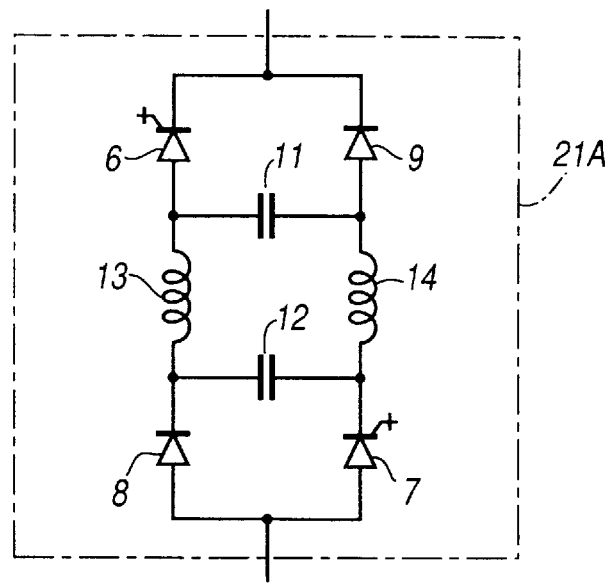
FIG. 3 is a circuit diagram showing first and second embodiments of the power converter.

FIG. 3 is a circuit diagram of switch unit 21A which is this embodiment.

FIG. 3 represents one switch unit. Although a converter is composed of multiple units as in FIG. 1, since the composition and operation of each switch unit is the same, then their descriptions have been omitted.

In FIG. 3, the anode of GTO 7 and the anode of diode 8 are connected. This connection point forms one end of switch unit 21A in FIG. 3. One end of reactor 13 and one end of capacitor 12 are connected to the cathode of diode 8. The other end of capacitor 12 is connected to the cathode of GTO 7 and one end of reactor 14. The anode of GTO 6 and one end of capacitor 11 are connected to the other end of reactor 13.

The anode of diode 9 and the other end of capacitor 11 are connected to the other end of reactor 14. The cathode of GTO 6 and the cathode of diode 9 are connected. This connection point forms the other end of switch unit 21A.

In FIG. 3, the current during the ON and OFF of GTOs 6 and 7 flows respectively through reactors 13 and 14. When that current varies, according to that rate-of-change, voltages are generated at both ends of reactors 13 and 14. Normally, because those voltages are of a sufficiently larger value than the randomness of the forward voltage-drops of the GTOs and diodes, they act to inhibit the unbalance of the two parallel currents.

Reactors 13 and 14 also have the effect of inhibiting the variation of the respective currents which are flowing, and they act to inhibit the difference in size of the currents generated by the randomness of the switching characteristics of GTOs 6 and 7, even though the ON/OFF times are random(e.g. there is a little bit difference of the ON/OFF times between GTO 6 and GTO 7).

The second embodiment is the case when the inductance values of the two reactors 13 and 14 in FIG. 3 have been selected so that they are equal. This embodiment is not illustrated.

Since the basic operation is the same as in the first embodiment, its description is omitted.

In particular, by selecting the inductance values so that they are just equal, there is no difference in the impedances of the circuits through which the two parallel currents pass, and the current sharing is improved.

Figure 4:
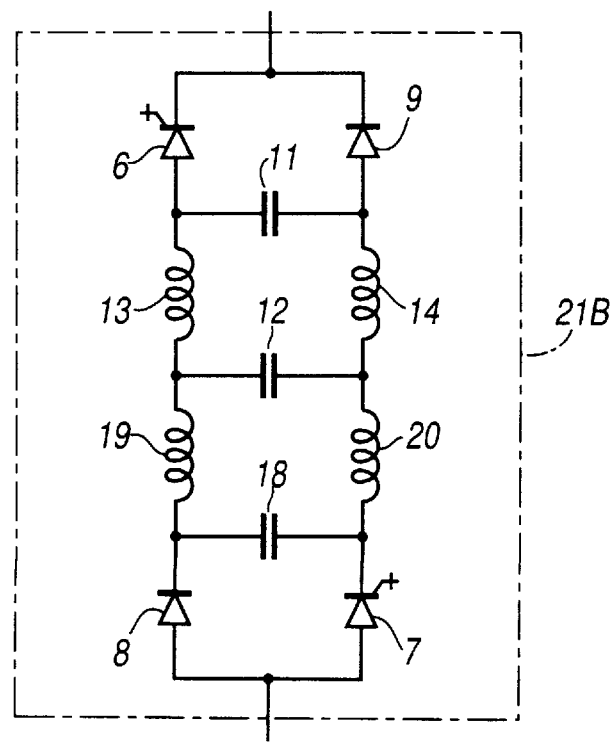
FIG. 4 is a circuit diagram showing third, fourth and fifth embodiments of the power converter.

FIG. 4 shows a third embodiment of a power converter of this invention. This drawing is a block diagram of switch unit 21B.

In FIG. 4, one end of reactor 13 is connected to one end of each of capacitor 12 and reactor 19. One end of reactor 14 is connected to the other end of capacitor 1.2 and to one end of reactor 20. The other end of reactor 19 is connected to one end of capacitor 18 and the cathode of diode 8. The other end of reactor 20 is connected to the other end of capacitor 18 and the cathode of GTO 7. Since the composition thereafter and the basic operation equate to FIG. 3, their descriptions are omitted.

When using this embodiment, since the voltages generated at both ends of the reactors are sufficiently larger values than the randomness of the forward voltage-drops of the GTOs and diodes, the unbalance of the two parallel currents can be inhibited.

Moreover, compared with the embodiment in FIG. 3, since the number of capacitors can be increased, the combined capacitance of the capacitors as a whole can be increased. Since the overall combined capacitance can be increased, the unbalance of the two parallel currents can be inhibited more rapidly than with the embodiment in FIG. 3.

The fourth embodiment is the case when the capacitances of capacitors 11, 12 and 18 in FIG. 4 have been selected so that they are equal. This embodiment is not illustrated.

By selecting the capacitances so that they are equal, when the capacitors are charging and discharging, there is no difference in the impedances of the circuits through which the two parallel currents pass, and the current sharing is improved.

The fifth embodiment is the case when the capacitance of capacitor 12 in FIG. 4 is made a greater capacitance value than the other two capacitors 11 and 18. This embodiment also is not illustrated.

Since, by this means, the charging currents flowing in the capacitors become smaller when the capacitors are charging and discharging, the effect is that unbalance of the parallel currents flowing in the two GTOs 6 and 7 can be inhibited.

Figure 5:
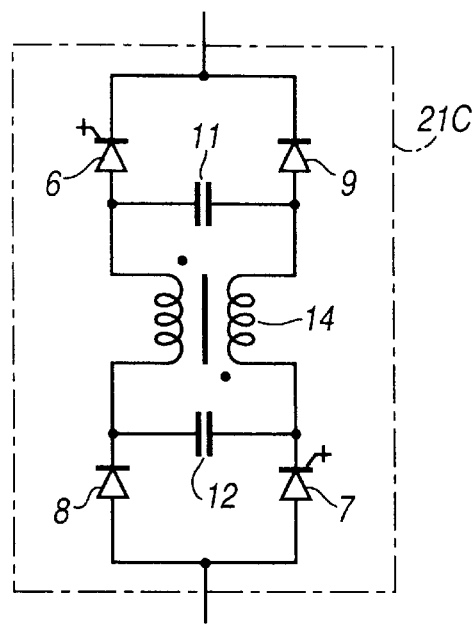
FIG. 5 is a circuit diagram showing a sixth embodiment of the power converter.

FIG. 5 is a sixth embodiment of the power converter of this invention. The drawing is a block diagram of switch unit 21C.

In FIG. 5, the cathode of diode 8 is connected to one end of capacitor 12 and one end of one of the windings of reactor (transformer) 14. The other end of that one winding of reactor 14 is connected to one end of capacitor 11 and the anode of GTO 6.

The cathode of GTO 7 is connected to the other end of capacitor 12 and one end of the other winding of reactor 14. The other end of that other winding of reactor 14 is connected to the other end of capacitor 11 and the anode of diode 9.

Since the composition thereafter equates to FIG. 3, its description is omitted. In FIG. 5, the windings of reactor 14 are coupled in the directions shown in the drawing (the beginnings of the windings are shown by □).

By this coupling, when the parallel currents are flowing equally in the same direction (for instance, from the bottom to the top of the drawing), reactor 14 hardly operates.

However, when an unbalance occurs in the parallel currents, mutual inductance is generated by the coupling operation of reactor 14, and the unbalanced parts of the currents are inhibited.

Figure 6:
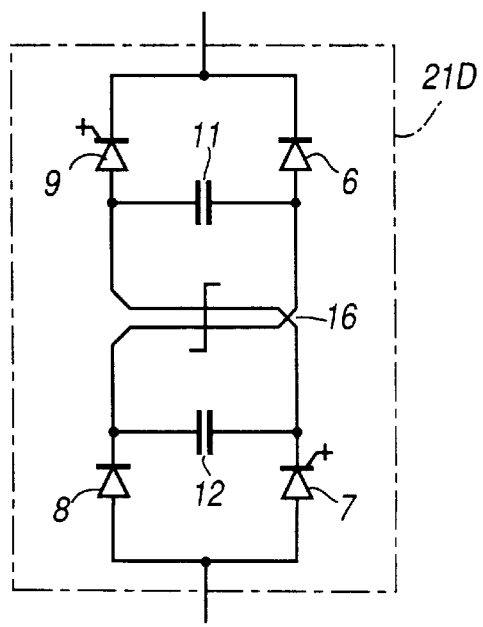
FIG. 6 is a circuit diagram showing a seventh embodiment of the power converter.

FIG. 6 is a seventh embodiment of the power converter of this invention. The drawing is a block diagram of switch unit 21D.

In FIG. 6, the cathode of diode 8 is connected to one end of capacitor 12 and, at the same time, is connected to one end of capacitor 11 and the anode of GTO 6 via ferrite core 16 on which a specified number of turns of copper wire are wound as the primary side. The cathode of GTO 7 is connected to the other end of capacitor 12 and, at the same time, is connected to the other end of capacitor 11 and the anode of diode 9 via ferrite core 16 on which a specified number of turns of copper wire are wound as the secondary side. Since the composition thereafter equates to FIG. 3, its description is omitted.

By this means also, the operation is to inhibit the unbalance of the two parallel currents in the same way as in the sixth embodiment.

When using this embodiment, ferrite core 16 operates as a saturable reactor. In particular, since it has B-H curve characteristics, it only operates during the rising of the transient current. Therefore, the effect is outstanding when compared with the embodiment in FIG. 5.

Figure 7:
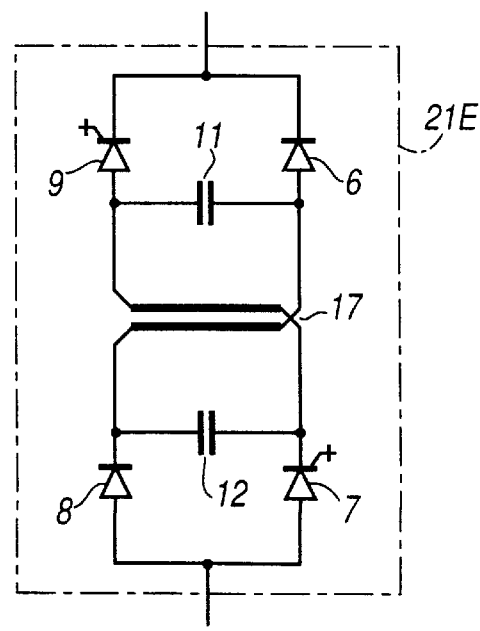
FIG. 7 is a circuit diagram showing an eighth embodiment of the power converter.

FIG. 7 is an eighth embodiment of the power converter of this invention. The drawing is a block diagram of switch unit 21E.

In FIG. 7, the cathode of diode 8 is connected to one end of capacitor 12 and, at the same time, is connected to one end of capacitor 11 and the anode of GTO 6 via closely coupled parallel bus (conductive bar) 17 in which silicon steel plates are laminated and around which a specified number of turns of copper wire are wound as the primary side. The cathode of GTO 7 is connected to the other end of capacitor 12 and, at the same time, is connected to the other end of capacitor 11 and the anode of diode 9 via closely parallel bus 17 around which a specified number of turns of copper wire are wound as the secondary side. Since the composition thereafter equates to FIG. 3, its description is omitted.

By this means also, the operation is to inhibit the unbalance of the two parallel currents in the same way as in the sixth embodiment.

Incidentally, in the various embodiments mentioned above, the semiconductor elements which compose the power converters are taken as GTOs. However, this invention is not limited to GTOs alone, and the same effects can be obtained even by using other types of self-turn-off switching devices.

Also, the above descriptions have taken as examples power converters composed by bridge-connecting arms which are composed of one switch unit. However, with this invention there are no limits to the number of switch units, and the same effects can be obtained in the case of composing the arms by series-connecting multiple switch units or in the case of composing the arms by parallel-connecting multiple switch units.

When comparing the embodiments of FIG. 5, FIG. 6 and FIG. 7, cost-wise the embodiment of FIG. 7 is the cheapest, and they become dearer in the order of the embodiment of FIG. 6 and the embodiment of FIG. 5.

When using the various embodiments as described above, the unbalance of the parallel currents which flow in two self-turn-off switching devices (GTOs) which conduct currents in parallel can be inhibited. Therefore, the thermal conditions in each GTO, which are the cause of losses generated by passing currents, can also be made almost equal. Also, a power converter with a good utilization factor can be provided which has no limits to capacitance design etc. of systems due to the restraints of one side being biased.

Obviously, numerous additional modifications and variations of the present invention are possible in light of the above teachings. It is therefore to be understood that within the scope of the appended claims, the invention may be practised otherwise than as specifically described herein.

What is claimed as new and desired to be secured by Letters Patent of the United States is:

1. A power converter having a plurality of switch units, each of said switch units comprising:

a first series circuit in which one end of a first reactor is connected to a cathode of a first self-turn-off switching device, while an anode of a first diode is connected to the other end of said first reactor;

a second series circuit in which one end of a second reactor is connected to a cathode of a second diode, while the anode of a second self-turn-off switching device is connected to the other end of said second reactor;

a first capacitor which is connected between a first series connection point, formed by the cathode of said first self-turn-off switching device and said one end of said first reactor, and a second series connection point, formed by the cathode of said second diode and the one end of said second reactor;

a second capacitor which is connected between a third series connection point, formed by the anode of said first diode and the other end of said first reactor, and a fourth series connection point, formed by the anode of said second self-turn-off switching element and the other end of said second reactor;

the anode of said first self-turn-off switching element being connected to the anode of said second diode and the cathode of said first diode being connected to the cathode of said second self-turn-off switching device.

2. A power converter according to claim 1, wherein:

an impedance of said first reactor is equal to that of said second reactor.

3. A power converter having a plurality of switch units, each of said switch units comprising:

a first series circuit in which one end of a first reactor is connected to a cathode of a first self-turn-off switching device, while one end of a second reactor is connected to the other end of the said first reactor, and an anode of a first diode is connected to the other end of said second reactor;

a second series circuit in which one end of a third reactor is connected to a cathode of a second diode, while one end of a fourth reactor is connected to the other end of said third reactor, and an anode of a second self-turn-off switching device is connected to the other end of the said fourth reactor;

a first capacitor which is connected between a first series connection point, formed by the cathode of the said first self-turn-off switching device and said one end of said first reactor, and a second series connection point, formed by the cathode of said second diode and one end of said third reactor;

a second capacitor which is connected between a third series connection point, formed by the other end of said first reactor and one end of said second reactor, and a fourth series connection point, formed by the other end of said third reactor and one end of said fourth reactor;

a third capacitor which is connected between a fifth series connection point, formed by the anode of said first diode and the other end of said second reactor, and a sixth series connection point, formed by the anode of said second self-turn-off switching device and the other end of the said fourth reactor;

the anode of said first self-turn-off switching device being connected the anode of said second diode; and the cathode of said first diode being connected to the cathode of said second self-turn-off switching device.

4. A power converter according to claim 3, wherein:

a capacitance of said first capacitor, said second capacitor and said third capacitor is the same in value.

5. A power converter according to claim 3, wherein:

the capacitance value of said second capacitor is greater than that of said first capacitor or said third capacitor.

6. A power converter having a plurality of switch units, each of said switch units comprising:

a first series circuit in which one end of a first winding of a reactor having at least two or more coupled windings is connected to a cathode of a first self-turn-off switching device, while an anode of a first diode is connected to the other end of the first winding of said reactor;

a second series circuit in which one end of the second winding of said reactor is connected to a cathode of a second diode, while an anode of a second self-turn-off switching device is connected to the other end of the second winding of said reactor;

a first capacitor which is connected between a first series connection point, formed by the cathode of said first self-turn-off switching device and said one end of the first winding of said reactor, and a second series connection point, formed by the cathode of said second diode and the one end of the second winding of the said reactor;

a second capacitor which is connected between a third series connection point, formed by the anode of said first diode and the other end of the first winding of said reactor, and a fourth series connection point, formed by the anode of said second self-turn-off switching device and the other end of the second winding of said reactor;

the anode of said first self-turn-off switching device being connected to the anode of said second diode; and the cathode of said first diode being connected to the cathode of said second self-turn-off switching device.

7. A power converter according to claim 6, wherein:

said reactor is a transformer.

8. A power converter according to claim 6, wherein:

said reactor is a ferrite core.

9. A power converter according to claim 6, wherein:

said reactor is a bus.

* * * * *